United States Patent
Cellek

(10) Patent No.: US 10,236,320 B2
(45) Date of Patent: Mar. 19, 2019

(54) FRACTAL-EDGE THIN FILM AND METHOD OF MANUFACTURE

(71) Applicant: OmniVision Technologies, Inc., Santa Clara, CA (US)

(72) Inventor: Oray Orkun Cellek, Mountain View, CA (US)

(73) Assignee: OmniVision Technologies, Inc., Santa Clara, CA (US)

(*) Notice: Subject to any disclaimer, the term of this patent is extended or adjusted under 35 U.S.C. 154(b) by 211 days.

(21) Appl. No.: 15/268,190

(22) Filed: Sep. 16, 2016

(65) Prior Publication Data

US 2017/0005133 A1    Jan. 5, 2017

Related U.S. Application Data

(62) Division of application No. 14/323,533, filed on Jul. 3, 2014, now Pat. No. 9,679,940.

(51) Int. Cl.
*B32B 3/10* (2006.01)
*H01L 27/146* (2006.01)

(52) U.S. Cl.
CPC .... *H01L 27/14685* (2013.01); *H01L 27/1462* (2013.01); *H01L 27/14687* (2013.01)

(58) Field of Classification Search
None
See application file for complete search history.

(56) References Cited

U.S. PATENT DOCUMENTS

| | | | |
|---|---|---|---|
| 5,567,658 A | 10/1996 | Wang et al. | |
| 5,700,606 A | 12/1997 | Kobayashi et al. | |
| 6,452,553 B1 | 9/2002 | Cohen | |
| 7,384,860 B2 * | 6/2008 | Nakamura | H01L 21/3226 438/486 |
| 7,423,265 B2 | 9/2008 | Matteo et al. | |
| 8,334,554 B2 | 12/2012 | Kim et al. | |
| 2007/0033980 A1 | 2/2007 | Nishimura | |

(Continued)

FOREIGN PATENT DOCUMENTS

| | | |
|---|---|---|
| CN | 101687390 A | 3/2010 |
| WO | 2013047056 A1 | 4/2013 |

OTHER PUBLICATIONS

First Office Action corresponding to Chinese Patent Application No. 201510382319, dated Sep. 14, 2017.

(Continued)

*Primary Examiner* — Christopher M Polley
(74) *Attorney, Agent, or Firm* — Lathrop Gage LLP

(57) ABSTRACT

A method of manufacturing a fractal-edge thin film includes determining an area shape to be covered by the fractal-edge thin film. The method also includes generating a thin-film perimeter based upon the area shape, the thin-film perimeter having a fractal dimension exceeding one. The method also includes determining a photomask perimeter such that a photomask with the photomask perimeter, when used in a photolithography process, yields a fractal-edge thin film with the thin-film perimeter. The method may also include photolithographically etching a thin-film, the thin film having a photoresist layer disposed thereon, the photoresist layer having been exposed through the photomask, wherein the etching results in the fractal-edge thin film.

3 Claims, 11 Drawing Sheets

(56) References Cited

U.S. PATENT DOCUMENTS

2013/0088555 A1  4/2013 Hanina
2013/0141369 A1  6/2013 Huang

OTHER PUBLICATIONS

U.S. Appl. No. 14/323,533, Final Rejection dated Nov. 15, 2016, 16 pages.
U.S. Appl. No. 14/323,533, Office Action dated Jul. 13, 2016, 9 pages.
Wu el al., A transparent electrode based on a metal nanotrough network; https://web.stanford.edu/group/cui_group/papers/Hui_2013.pdf May 19, 2013, Nature Nanotechnology, pp. 1-5.
Taiwan Patent Application No. 104120591, English translation of First Office Action dated Dec. 12, 2016, 3 pages.

\* cited by examiner

FRACTAL-EDGE THIN FILM AND METHOD OF MANUFACTURE

CROSS-REFERENCE TO RELATED APPLICATIONS

This application is a divisional of U.S. patent application Ser. No. 14/323,533 filed Jul. 3, 2014. The entire content of the aforementioned application is incorporated herein by reference.

FIELD OF THE INVENTION

This invention relates to complementary metal-oxide-semiconductor (CMOS) image sensors, thin-film layers on CMOS image sensors, and particularly, adherence of a thin-film layer on CMOS image sensors in response to stresses within the layer.

BACKGROUND

Most digital cameras manufactured for general purpose use include a CMOS image sensor that converts light incident on the camera into electrical signals. CMOS image sensors include an array of pixels positioned at the image plane of the camera. A protective layer, known as a passivation layer, deposited on top of the CMOS image sensor substantially protects the image sensor pixels from damage. The protective layer is typically a transparent nitride or oxide, such as silicon nitride or silicon dioxide.

In certain environmental conditions, including high temperature, poor adhesion and/or stress causes the protective layer to peel off of, or delaminate from, the CMOS image sensor. Process limitations of the photodiodes, microlenses, and color filters in the CMOS image sensor substrate limit available methods of improving layer adhesion that are used for other substrates.

FIG. 1 shows a plan view of a prior-art thin film 100 deposited on a surface 112 of an image sensor 102. In the x and y directions, defined by a coordinate axis 198, the distances between perimeter 101 of thin film 100 and the edges of image sensor 102 are DX and DY, respectively.

FIG. 2 shows a cross-sectional view AA' of thin film 100 and image sensor 102 of FIG. 1, illustrating peeling 208 from surface 112 of image sensor 102. Peeling 208 may result from a tensile stress 206 within thin film 100 in response to a compressive stress 204 in image sensor 102.

Compressive stresses 204 are caused, for example, by a decrease in ambient temperature. When the thermal expansion coefficient of image sensor 102 is larger than that of thin film 100, image sensor 102 contracts more than thin film 100 in response to a temperature decrease. This unequal thermal contraction results in compressive forces 204 at bottom surface 210 of thin film 100 pointing toward the center of thin film 100. Tensile stresses 206 form within thin film 100 in response to compressive forces 204. Peeling 208 of thin film 100 from surface 112 relieves the interaction of tensile stresses 206 and compressive forces 204.

SUMMARY OF THE INVENTION

According to one embodiment, a fractal-edge thin film is provided. The fractal-edge thin film includes a material layer having a perimeter with a fractal dimension exceeding one, the material layer having greater peel resistance as compared to a thin-film material layer with fractal dimension equaling one.

According to another embodiment, a method of manufacturing a fractal-edge thin film is provided. The method includes determining an area shape to be covered by the fractal-edge thin film. The method also includes generating a thin-film perimeter based upon the area shape, the thin-film perimeter having a fractal dimension exceeding one. The method also includes determining, based upon the thin-film perimeter, a photomask perimeter, such that a photomask with the photomask perimeter, when used in a photolithography process, yields a fractal-edge thin film with the thin-film perimeter. The method may also include photolithographically etching a thin-film, the thin film having a photoresist layer disposed thereon, the photoresist layer having been exposed through the photomask via the photolithographic process, wherein the etching results in the fractal-edge thin film.

According to another embodiment, a fractal-edge thin film is provided. The fractal-edge thin film is manufactured according to a method that includes: determining an area shape to be covered by the fractal-edge thin film; generating a thin-film perimeter based upon the area shape, the thin-film perimeter having a fractal dimension exceeding one; and generating a thin film that has the area shape and thin-film perimeter.

DETAILED DESCRIPTION

This disclosure describes thin films with fractal-shaped edges for increased delamination resistance.

Figure 1:
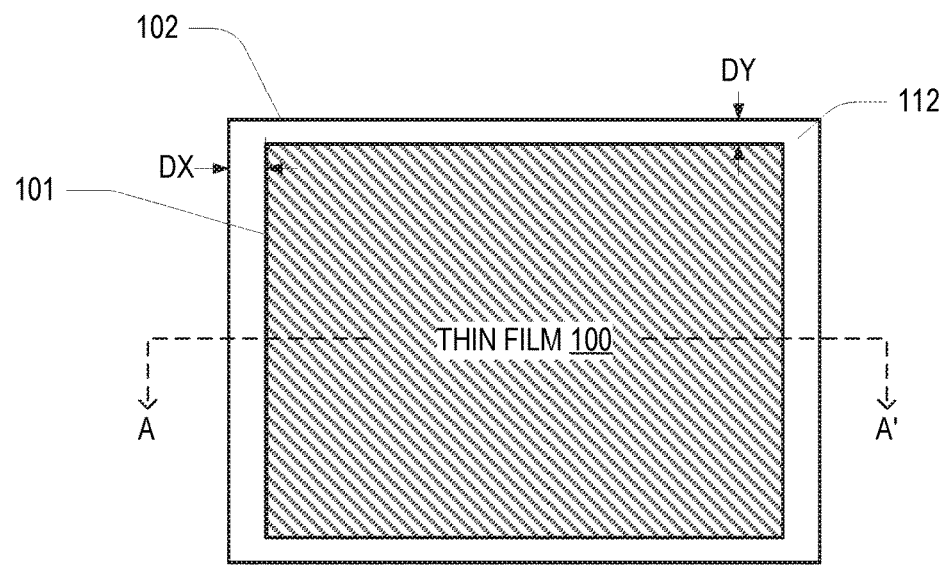
FIG. 1 shows a plan view of a prior-art thin film deposited on a surface of an image sensor.
Figure 2:
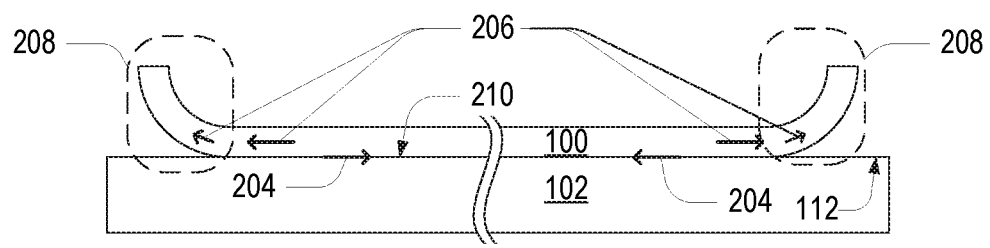
FIG. 2 is a cross-sectional view of the thin film of FIG. 1 and the image sensor of FIG. 1 illustrating peeling from the surface of the image sensor.
Figure 3:
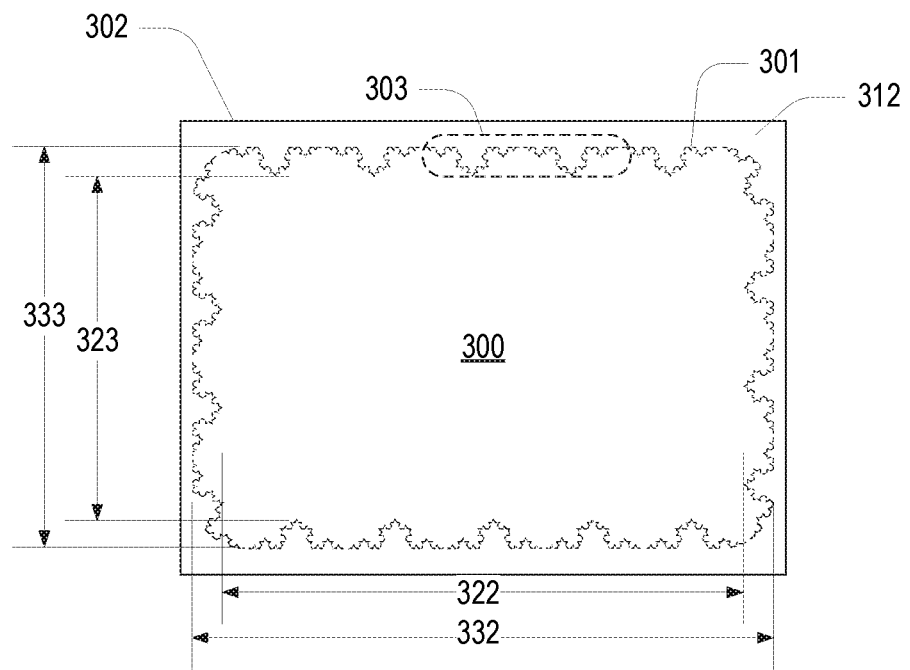
FIG. 3 is a plan view of an exemplary fractal-edge thin film deposited onto a surface of a CMOS image sensor, where fractal-edge thin film is formed with a fractal perimeter, in an embodiment.

FIG. 3 is a plan view of an exemplary fractal-edge thin film 300 deposited onto a surface 312 of a CMOS image sensor 302, where a fractal-edge thin film 300 is formed with a fractal perimeter 301. In the embodiment of FIG. 3, fractal-edge thin film 300 is a material layer covering a rectangular region of surface 312. In the plane of fractal-edge thin film 300, the inner dimensions of fractal-edge thin film 300 are inner width 322 and inner height 323. In this plane, the outer dimensions of fractal-edge thin film 300 are outer width 332 and outer height 333. Inner width 322 and inner height 323 determine the area shape of thin film 300.

Figure 4:
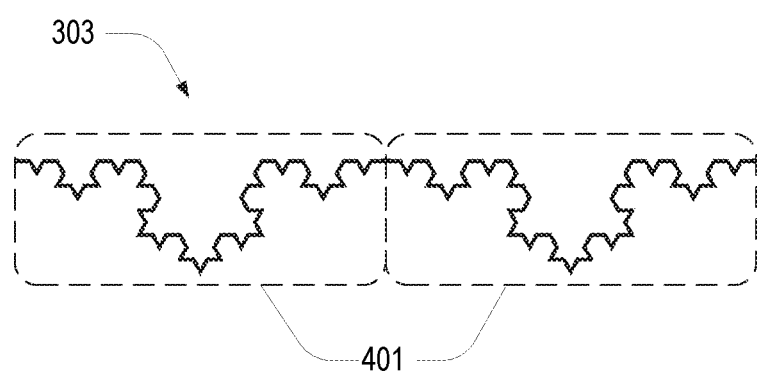
FIG. 4 shows a magnified version of a perimeter portion of fractal-edge thin film shown in FIG. 3, in an embodiment.

In the embodiment of FIG. 3, fractal-edge thin film 300 includes sections of an exemplary algorithm-generated self-similar fractal curve known as a Koch curve. FIG. 4 shows a magnified version of perimeter portion 303 of fractal-edge thin film 300. Perimeter portion 303 includes two fractal unit cells 401. Fractal perimeter 301 includes an array of adjacent fractal unit cells 401. Fractal perimeter 301 may include non-repeating fractal elements without departing from the scope herein.

In an embodiment, fractal-edge thin film 300 includes sections of other algorithm-generated fractal curves. These fractals may include, but are not limited to, the following as known in the art: a quadratic Koch curve, a Julia set, a Rauzy fractal, a Gosper curve, a Fibonacci word fractal, and the boundary of a dragon curve. Examples of Koch curves include Koch curves with random orientation and random intervals. A Gosper curve is the boundary of a Gosper island fractal. Examples of dragon curves include a twindragon curve and a terdragon.

Figure 5:
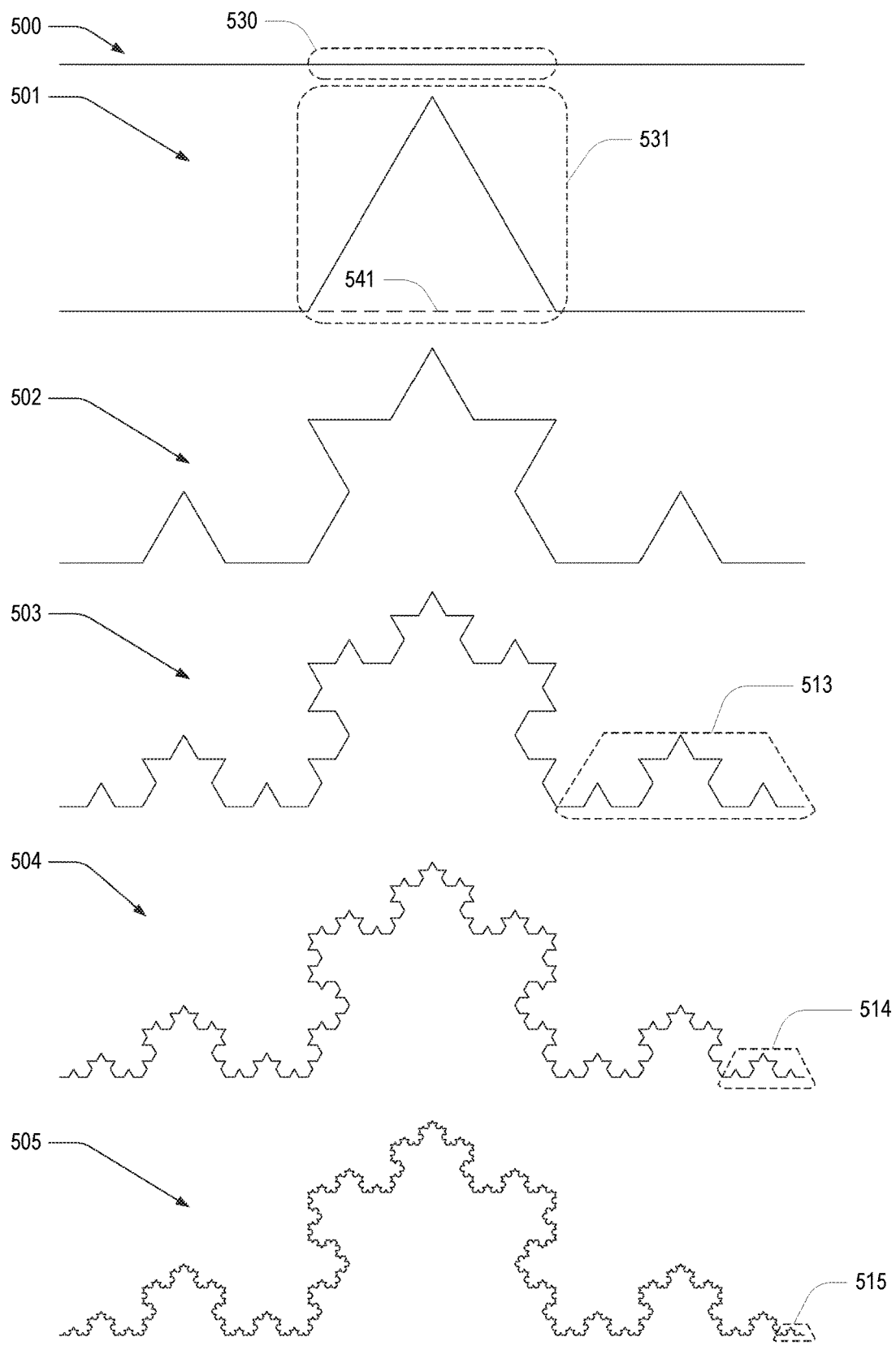
FIG. 5 shows the first five iterations of a Koch curve.

FIG. 5 shows the first five iterations 501-505 of a Koch curve. (Source: Wikimedia Commons.) Zeroth iteration Koch curve 500 is a line with, for illustrative purposes, a unit side length. According to the iteration formula of the Koch curve, the iteration n of the Koch curve is obtained from iteration (n−1) by replacing the center third of each line in iteration (n−1) with two sides of equilateral triangle with a side length equal to $\varepsilon = \frac{1}{3}$ the length of each line in iteration (n−1), where c is a scaling factor. Each triangle is oriented such that its third side, which is not part of the fractal curve, has its two endpoints corresponding to the endpoints of the replaced center-third line that the triangle replaced.

For example, a section 530 denotes the center third of zeroth iteration Koch curve 500. In a first iteration Koch curve 501, section 530 is replaced by two sides of an equilateral triangle 531. Dashed side 541 of equilateral triangle 531 is shown for illustrative purposes only.

The iteration formula for the Koch curve results in fractals that are self-similar. Koch curve iterations 503, 504, and 505 can be viewed as scaled and repeated instances of Koch curve iteration 502, as indicated by sections 513, 514, and 515 respectively.

By replacing the center third of one side with two sides of a triangle, the Koch curve iteration formula results in each iteration having N=4 times the number of sides as the previous iteration. For example, zeroth iteration Koch curve 500 has one side, first iteration Koch curve 501 has four sides, second iteration Koch curve 502 has sixteen sides, and third-iteration Koch curve 503 has sixty-four sides.

The values of N and ε determine the fractal dimension $D_F$ of the Koch curve according to the expression $D_F = \ln(N)/\ln(1/\varepsilon)$. In the mathematical fields of topology and fractals, $D_F$ is the Hausdorff dimension. Hausdorff dimension $D_F$ is a measure of how the detail of a curve changes as a function of the scale at which the curve is considered. The scaling factor E denotes the scale while the N-fold increase in number of sides indicates the change in detail. For the Koch curve, N=4 and $\varepsilon = \frac{1}{3}$, so $D_F = \ln(4)/\ln(3) = 1.26$.

The Hausdorff dimension $D_F$ is a specific instance of a more generally applicable fractal dimension known in the art as the box-counting dimension, $D_B$. The box-counting dimension, $D_B$ is also known as the Minkowski-Bouligand dimension. In curves for which $D_F$ can be computed, such as formula-generated fractals and curves made from conic sections, the values of $D_F$ and $D_B$ agree.

Figure 6:
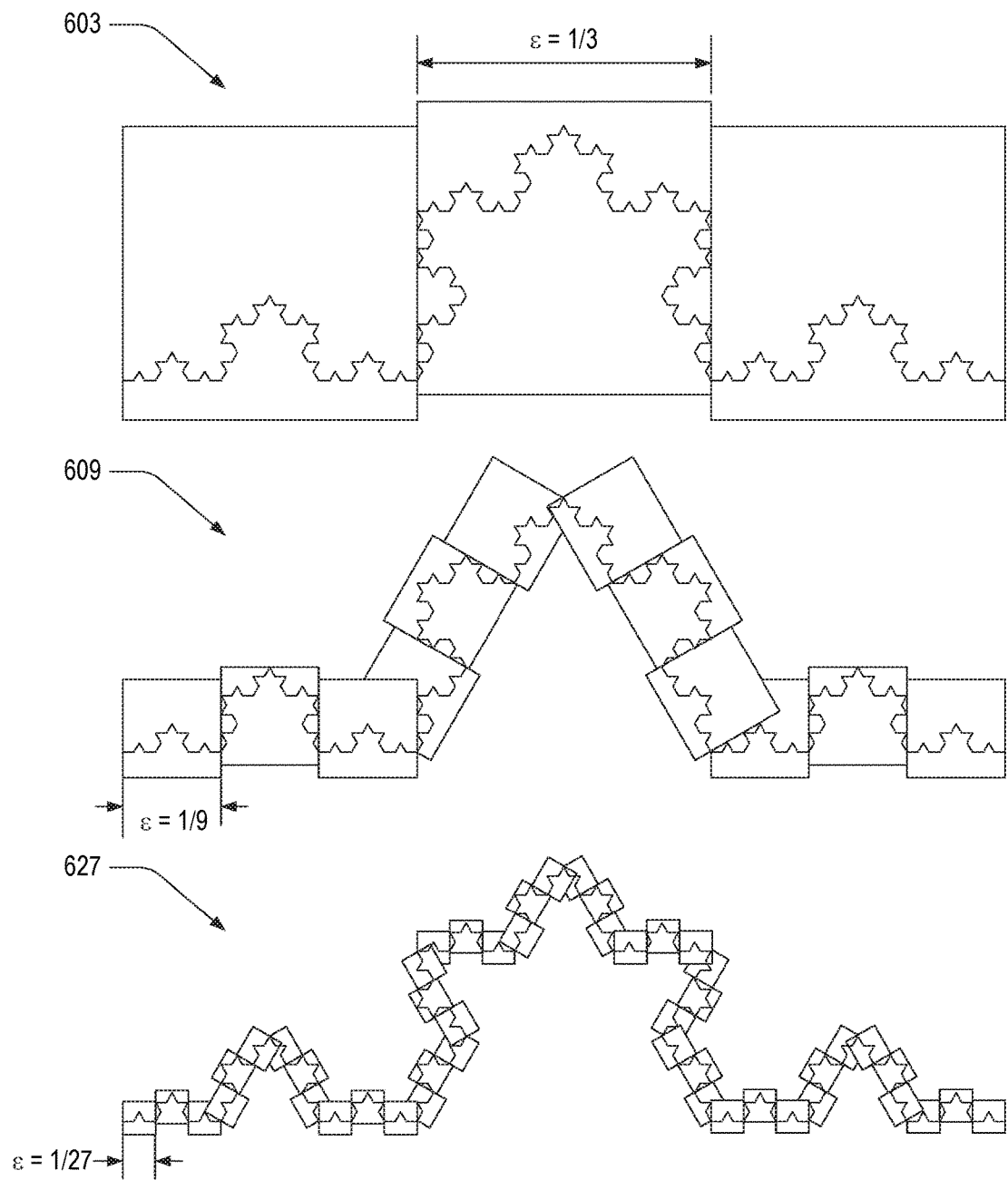
FIG. 6 illustrates the graphical portion of computing a box-counting dimension for the Koch curve.

FIG. 6 illustrates the graphical portion of computing a box-counting dimension $D_B$ for a Koch curve. FIG. 6 shows covered Koch curves 603, 609, and 627. The Koch curves in each of covered Koch curves 603, 609, and 627 are a fourth-iteration Koch curves, illustrated by Koch curve iteration 504, and have the same spatial dimensions. Covered Koch curves 603, 609, and 627 are covered with square boxes of side length $\varepsilon = \frac{1}{3}$, $\frac{1}{9}$, and $\frac{1}{27}$ respectively. On covered Koch curve 603, $N(\varepsilon)=3$ boxes of side-length $\varepsilon = \frac{1}{3}$ are required to cover the curve. On covered Koch curve 609, $N(\varepsilon)=9$ boxes of side-length $\varepsilon = \frac{1}{9}$ are required to cover the curve. On covered Koch curve 627, $N(\varepsilon)=27$ boxes of side-length $\varepsilon = \frac{1}{27}$ are required to cover the curve. In general, for a square side length $\varepsilon = \frac{1}{4}$, $N(\varepsilon) = N(\frac{1}{3}^m) = 3 \cdot 4^{m-1}$, where m is a non-negative integer. FIG. 6 is adapted from a Yale University webpage "Box-Counting Dimension of the Koch Curve": http://classes.yale.edu/fractals.

The expression for the box-counting dimension $D_B$ is the same as that of the Hausdorff dimension, but in the limit of $\varepsilon \to 0$: $D_B = \lim_{\varepsilon \to 0}[\ln(N(\varepsilon))/\ln(1/\varepsilon)]$. Applied to the Koch curve, the value of the box-counting dimension $D_B$ equals the value of the Hausdorff dimension $D_F$:

$$\lim_{\varepsilon \to 0} \frac{\ln(N(\varepsilon))}{\ln(1/\varepsilon)} = \lim_{m \to \infty} \frac{\ln(3 \cdot 4^{m-1})}{\ln(3^m)} = \frac{\ln(4)}{\ln(3)} = 1.26.$$

The box-counting dimension $D_B$ may be used to characterize measured fractal curves. Measured fractal curves are generated from measured quantities, rather than from fractal-generating algorithms. Measured fractal curves include natural fractals, such as coastlines, shorelines, river tributary networks, mountain ranges. Temporal price variations, such as time-series prices in financial markets, have fractal features and hence are also measured fractal curves. Hereinafter and unless noted otherwise, fractal dimension refers to the fractal dimension computed by the box-counting method.

Herein, reference to the fractal dimension to a curve indicates that the curve has a fractal dimension $D_B > 1$. The fractal dimension of non-fractal curve is $D_B = 1$, and hence is a "fractal dimension" in name only.

One connection between fractal dimension and shear stress is the micro-roughness features of gravel streams in response to sediment transport patterns. Civil engineers A. G. Tsakaris and A. N. Papanicolaou characterized the micro-roughness features of particle clusters on the stream bed surface layer by computing their fractal dimension using a box-counting method. (See "A fractal approach for characterizing microroughness in gravel streams," *Archives of Hydro-Engineering and Environmental Mechanics*, 55:29-43 (2008)). They found that shape of particle clusters in a gravel stream, as described by the clusters' fractal dimension, is associated with the amount of shear stress arising from sediment transport in the gravel stream. For a significant range of shear stress levels, higher shear stress resulted in particle clusters with higher fractal dimensions in the plane of gravel transport.

This result suggests that increasing the fractal dimension of a thin film edge, or thin film perimeter, may increase its delamination resistance. Herein, the fractal dimension of a thin film refers to the fractal dimension of the thin film's perimeter, or edge. Moreover, the perimeter of a thin film and the perimeter of the material layer that constitutes the thin film are identical. The perimeter 201 of prior-art thin film 100 has a box-counting dimension of $N_D = 1$, which means that is lacks fractal features.

The method of generating the Koch curves of fractal perimeter 301 is known as an iterated function system, as described in FIG. 5. Other fractal generation methods may be employed to generate the edge shape of fractal-edge thin film 300 without departing from the scope hereof. These algorithms include, but are not limited to, fractal generation algorithms such as Lindenmayer systems, escape time algorithms, and stochastic algorithms.

Figure 7:
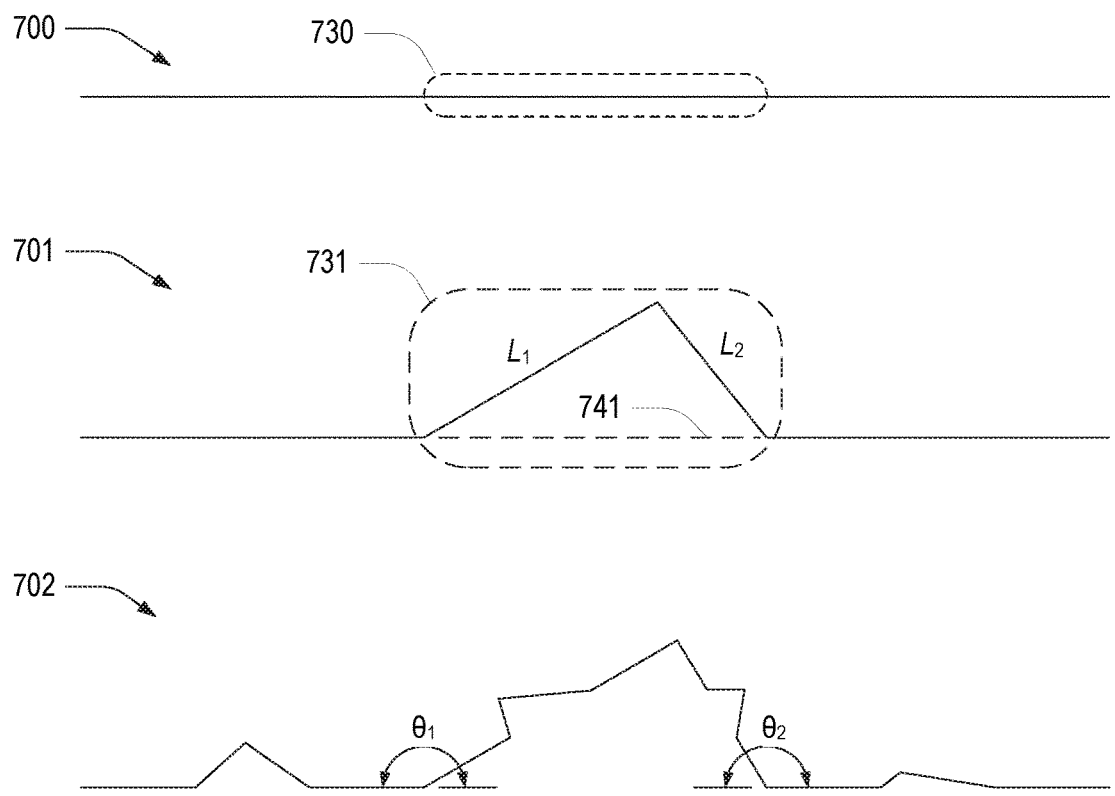
FIG. 7 shows the first three iterations of a Koch curve where the triangle side lengths, rather than being equal as in FIG. 5, are determined randomly.

In an alternative embodiment, fractal perimeter 301 results from the combination of a stochastic algorithm with an iterative function system. For example, FIG. 7 shows the first three iterations of a Koch curve where the triangle side lengths, rather than being equal as in FIG. 5, are determined randomly. As in zeroth iteration Koch curve 500 of FIG. 5, zeroth iteration 700 is a straight line. According to the iteration formula of this randomized Koch curve, the iteration n of the Koch curve is obtained from iteration (n−1) by replacing the center third of each line in iteration (n−1) with two sides of a triangle with two side lengths less than or equal to $\varepsilon = \frac{1}{3}$ the length of each line in iteration (n−1), where $\varepsilon$ is a scaling factor. The triangle is oriented such that the replaced center third of each line would be the third side of the triangle.

For example, in first iteration 701, the center third 730 of zeroth iteration 700 is replaced by two sides of a triangle 731. Dashed side 741 of triangle 731 is shown for illustrative purposes only. Each of the side lengths $L_1$ and $L_2$ of triangle 731 is shorter than center third 730, and the ratio $L_1/L_2$ is randomized for each straight line replacement. Iteration 702 is obtained by applying the iteration formula to each line segment in iteration 701. In iteration 702, angles $\theta_1$ and $\theta_2$ each equal 180°. Either or both of $\theta_1$ and $\theta_2$ may be different from 180° without departing from the scope herein.

A fractal-edge thin film 300 based on this type of Koch curve, with randomly-determined replacement triangle sides, has a fractal perimeter 301 that lacks self-similarity. Employing random variables is not necessary for generating fractals that lack self-similarity. For example, the side lengths $L_1$ and $L_2$ of FIG. 7 may be assigned deterministically, but with sufficient variation that such that the resulting fractal iterations, such as iteration 702, lack self-similarity.

The embodiments of fractal-edge thin films discussed above have perimeters with fractal dimensions ($D_B > 1$) by virtue of having perimeters defined in part by fractals determined by mathematical algorithm. The perimeters of fractal-edge thin films may also be determined from measurements of fractal properties of entities or events. Such entities include natural fractals such as shorelines. Such events include time-series asset prices financial markets. Financial market prices can be considered measurements of demand for goods sold in a market.

Coastlines and shorelines are naturally-occurring examples of non-self-similar fractals, also known as random fractals. In an embodiment of fractal-edge thin film 300, fractal perimeter 301 is generated using measured data of shorelines and coastlines. Example data sets include the World Vector Shoreline data file and the Global Self-consistent, Hierarchical, High-resolution Geography Database (GSHHG), both published on-line by the United States National Geographic Data Center.

In an embodiment of fractal-edge thin film 300, fractal perimeter 301 is generated using time-series prices of a financial market. For example, in "Financial multifractality and its subtleties: an example of DAX," physicists Gorski, Drożdż, and Speth use a box-counting method to determine the fractal dimension of a German stock market index over a time interval.

In an embodiment of fractal-edge thin film 300, fractal perimeter 301 is generated using an algorithm included in prior-art fractal coastline generating software. For example, the website of the planet-map generator maintained by Torben Mogensen at the University of Copenhagen includes the source code from which the algorithm may be extracted: http://www.diku.dk/~torbenm/Planet.

Figure 8:
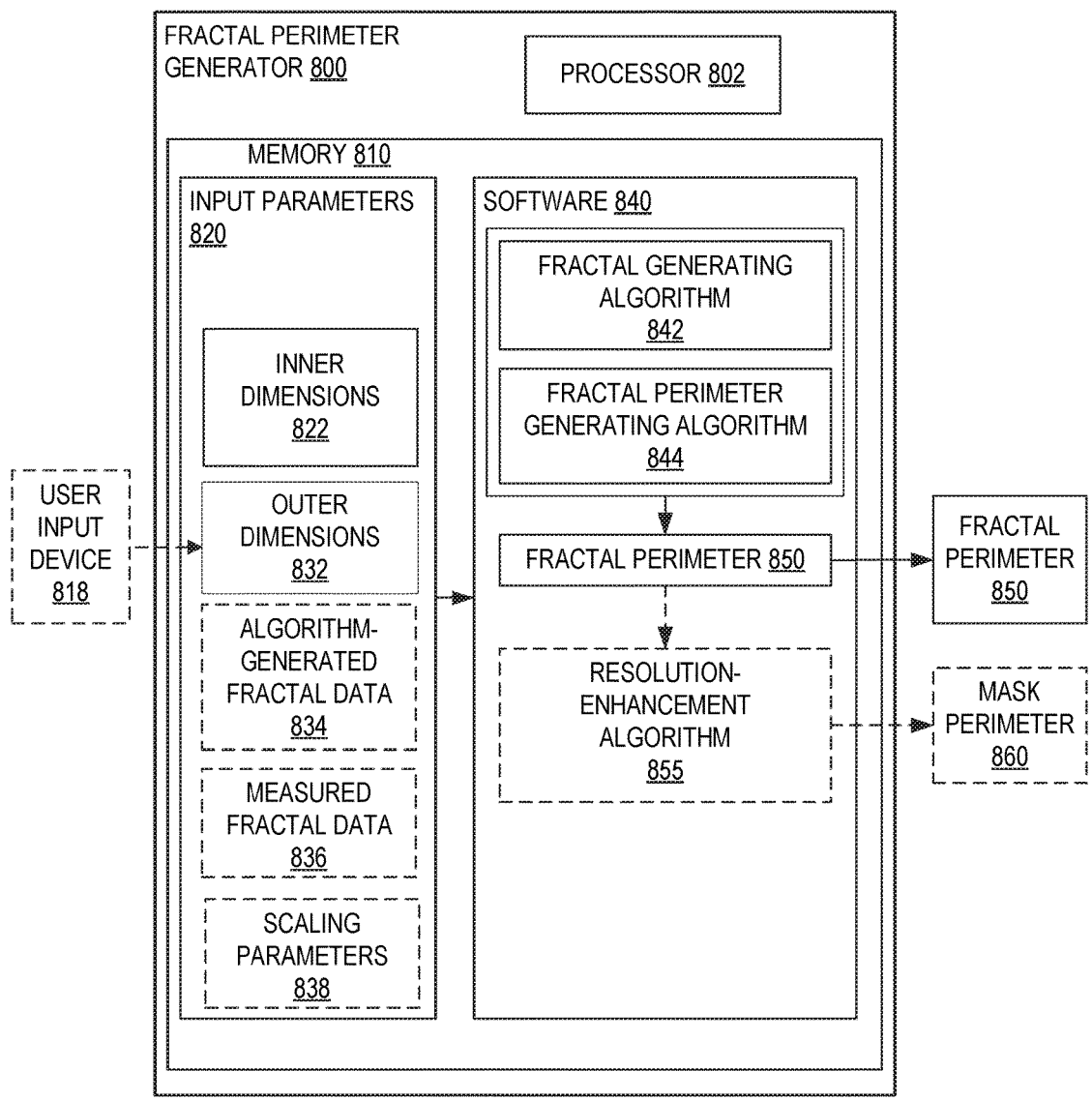
FIG. 8 is a schematic showing one exemplary fractal perimeter generator that generates fractal perimeter of the fractal-edge thin film of FIG. 3.

FIG. 8 is a schematic showing an exemplary fractal perimeter generator 800 that generates fractal perimeter 301 of fractal-edge thin film 300 of FIG. 3. Fractal perimeter generator 800 is for example a computer that includes a processor 802 and memory 810 storing input parameters 820 and software 840. Memory 810 represents one or both of volatile and non-volatile memory, as known in the art. Software 840 includes machine-readable instructions that are executed by processor 802 to implement the functionality of fractal perimeter generator 800, as described below. Software 840 includes a fractal generating algorithm 842 and a fractal-perimeter generating algorithm 844.

Input parameters 820 may include inner dimensions 822 and outer dimensions 832, which denote inner and outer dimensions of the thin-film perimeter, respectively. Examples of thin-film inner dimensions 822 are inner width 322 and inner height 323 of FIG. 3. Examples of thin-film outer dimensions 832 are outer width 332 and outer height 333 of FIG. 3. Input parameters 820 may also include algorithm-generated fractal data 834 and measured fractal data 836. Input parameters 820 may be received by user input device 818.

Input parameters 820 may also include scaling parameters 838. A scaling parameter, for example, specifies the spatial dimension of a fractal unit cell. The spatial dimension may be expressed in units of a standard length unit such as meters. Alternatively, the spatial dimension may be expressed relative to either or both of thin-film inner dimension 822 and thin-film outer dimensions 832. For example, in FIG. 3, fractal-edge thin film 300 includes five fractal unit cells 401 along a horizontal edge, and three fractal unit cells 401 along a vertical edge.

In an embodiment of fractal perimeter generator 800, input parameters 820 include inner dimensions 822, outer dimensions 832, algorithm-generated fractal data 834, and scaling parameters 838. Algorithm-generated fractal data 834 may specify a fractal iteration formula and an iteration order.

Software 840 receives input parameters 820. Fractal generating algorithm 842 receives algorithm-generated fractal data 834 to generate a fractal unit cell, for example, fractal unit cell 401 of FIG. 4. Fractal-perimeter generating algorithm 844 receives the output of fractal generating algorithm 842, inner dimensions 822, outer dimensions 832, and scaling data, to produce fractal perimeter 850. Fractal perimeter 301, FIG. 3, is an example of fractal perimeter 850.

Software 840 may also include a resolution-enhancement algorithm 855. Resolution-enhancement algorithm 855 receives fractal perimeter 850 and outputs mask perimeter 860. Mask perimeter 860 may specify the perimeter of a photomask used to photolithographically fabricate a fractal-edge thin film with fractal perimeter 850. Photomask features with high spatial-frequencies—those approaching the resolution limit of the photolithography systems—are low-pass filtered in the resulting patterns etched on the wafer. Resolution-enhancement algorithm 855 precompensates for this filtering. Resolution-enhancement algorithm 855 may employ resolution-enhancement methods known in the art of photolithography, for example, such as optical proximity correction and inverse lithography. The resulting mask perimeter 860 differs from fractal perimeter 850 and is optimized, for a given photolithography system, to produce a thin film with fractal perimeter 850. In an example of fractal perimeter generator 800, resolution-enhancement algorithm 855 is not used and mask perimeter 860 is geometrically identical to fractal perimeter 850.

Figure 9:
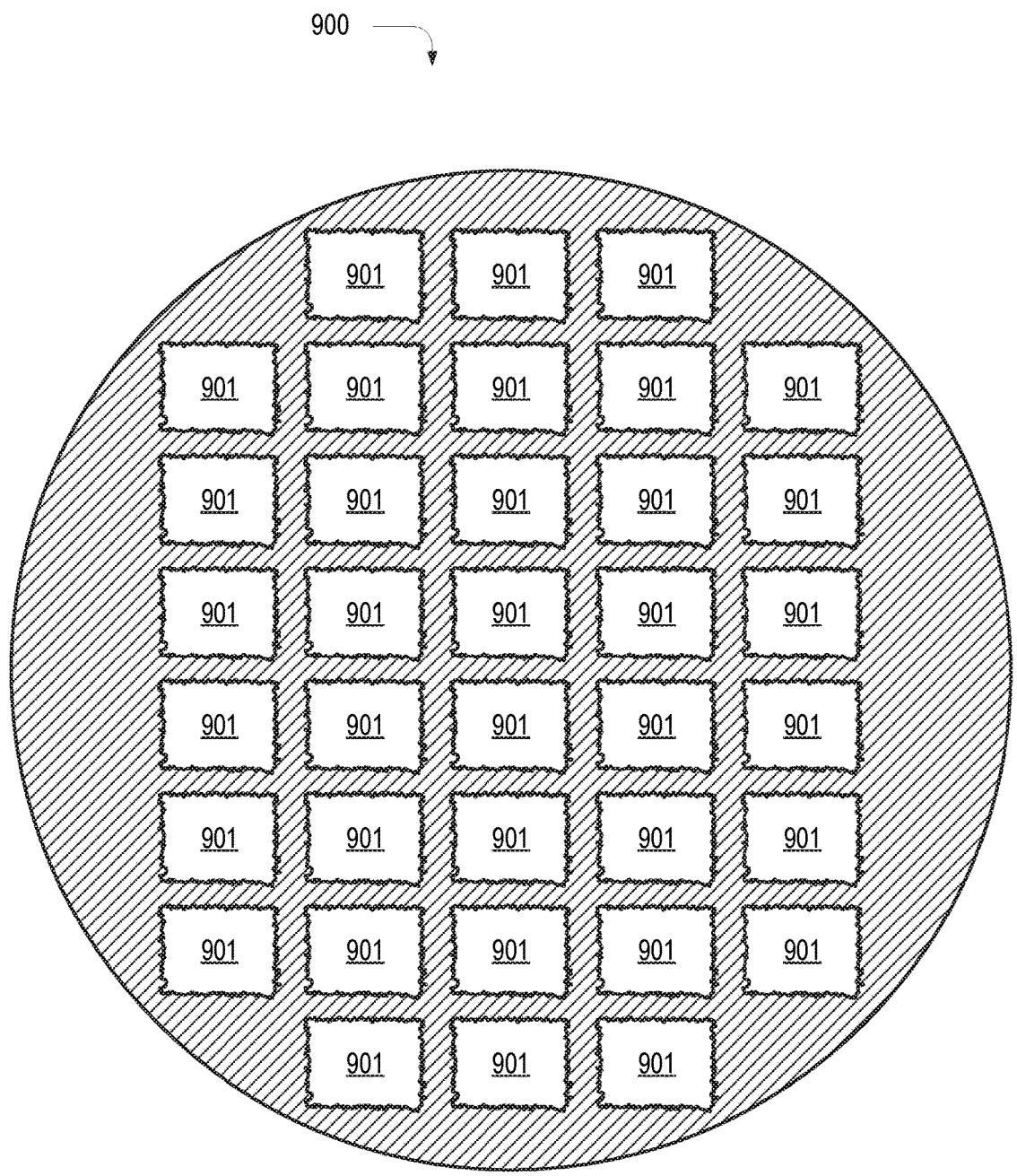
FIG. 9 is a plan view of an exemplary fractal-edge-generating photomask that includes an array of fractal-edge-generating mask apertures.

FIG. 9 is a plan view of an exemplary fractal-edge-generating photomask 900 that includes an array of fractal-edge-generating mask apertures 901. In an example of fractal-edge-generating photomask 900, fractal-edge-generating mask apertures 901 each have a mask perimeter 860 determined by fractal perimeter generator 800.

Figure 10:
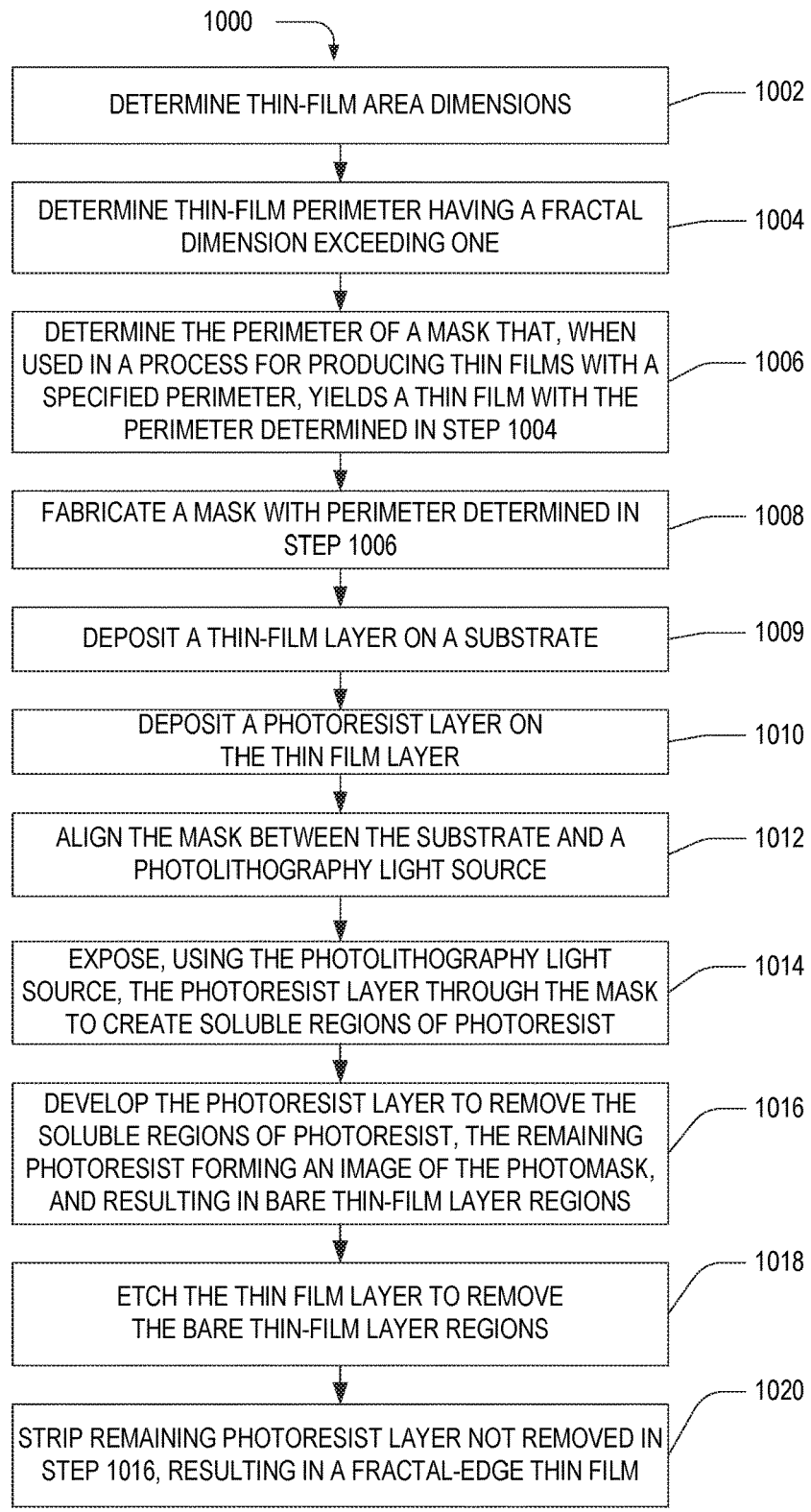
FIG. 10 is a flowchart illustrating a first exemplary method of manufacturing a fractal-edge thin film.

FIG. 10 is a flowchart illustrating an exemplary method 1000 of manufacturing a fractal-edge thin film.

In step 1002, method 1000 determines the dimensions of the thin film. In an example of step 1002, the thin film dimensions are defined by inner dimensions 822 and outer dimensions 832, which are input parameters of fractal perimeter generator 800. Inner dimensions 822 may determine the area shape of the thin film.

In step 1004, method 1000 determines a desired thin-film perimeter having a fractal dimension exceeding one. In one example of step 1004, method 1000 employs fractal perimeter generator 800 of FIG. 8.

In step 1006, method 1000 determines a perimeter of a mask, herein a "mask perimeter," that, when used in a process for producing thin films with a specified perimeter, yields a thin film with the perimeter determined in step 1004. In an example of step 1006, method 1000 determines a mask perimeter that differs from the desired thin-film perimeter because process effects result in thin-film perimeters that differ from mask perimeters. In an example of step 1006, method 1000 employs resolution-enhancement algorithm 855 within fractal perimeter generator 800 of FIG. 8.

In step 1008, method 1000 fabricates a mask with a perimeter, the perimeter being the mask perimeter determined in step 1006.

In an example of step 1008, the mask is fractal-edge-generating photomask 900. In this embodiment of fractal-edge-generating photomask 900, fractal-edge-generating mask apertures 901 each have a mask perimeter 860 determined by fractal perimeter generator 800. The use of fractal-edge-generating photomask 900 in a photolithography process, such as method 1000, results in a thin film having a perimeter with fractal dimension greater than one.

In step 1009, method 1000 deposits a thin film layer on a substrate. Step 1009 may be performed with thin-film deposition techniques known in the art. These techniques include, but are not limited, to spin-coating and chemical vapor deposition. The thin-film layer may be a material commonly used as a protective layer, for example, a transparent nitride or oxide such as silicon nitride or silicon dioxide.

In an example of step 1009, method 1000 deposits the thin film layer on a substrate that includes an image sensor. The image sensor is, for example, a CMOS image sensor.

In step 1010, method 1000 deposits a photoresist layer on the thin film layer. The photoresist material may be any photoresist material known in the art of photolithography, and may be either a positive or negative photoresist.

In step 1012, method 1000 aligns the mask between substrate, coated with the photoresist deposited in step 1010, and a photolithography light source. In an example of step 1012, the photoresist is negative and the mask is a photomask, such as fractal-edge-generating photomask 900, that includes an array of mask apertures (e.g., fractal-edge-generating mask apertures 901) aligned to an array of image sensors on the substrate. The photolithography light source may be any such light source known in the art, for example, a flood exposure source.

In step 1014, method 1000 exposes, using the photolithography light source, the photoresist layer through the mask to create soluble regions of photoresist.

In step 1016, method 1000 develops the photoresist layer to remove the soluble regions of photoresist. Step 1016 results in two regions of the thin-film layer: one or more bare regions and one or more regions covered by the remaining photoresist, which forms an image of the photomask. In an example of step 1016, the photoresist is a negative photoresist and the remaining photoresist forms a negative image of fractal-edge-generating photomask 900.

In step 1018, method 1000 etches the thin film layer to remove the one or more bare thin-film layer regions. In an example of step 1018, the remaining thin-film layer regions form an array of fractal-edge thin films similar to the array of mask apertures 901 of fractal-edge-generating photomask 900. A layer of photoresist remains on each thin-firm layer region.

In step 1020, method 1000 strips the remaining photoresist layer that had not been removed in step 1016, resulting in a fractal-edge thin film. In an example of step 1020, step 1020 results in multiple fractal edge thin films in an array aligned to mask apertures 901 of fractal-edge-generating photomask 900. Each fractal-edge thin film of the fractal-edge thin-film array coats a respective image sensor of the image sensor array.

Figure 11:
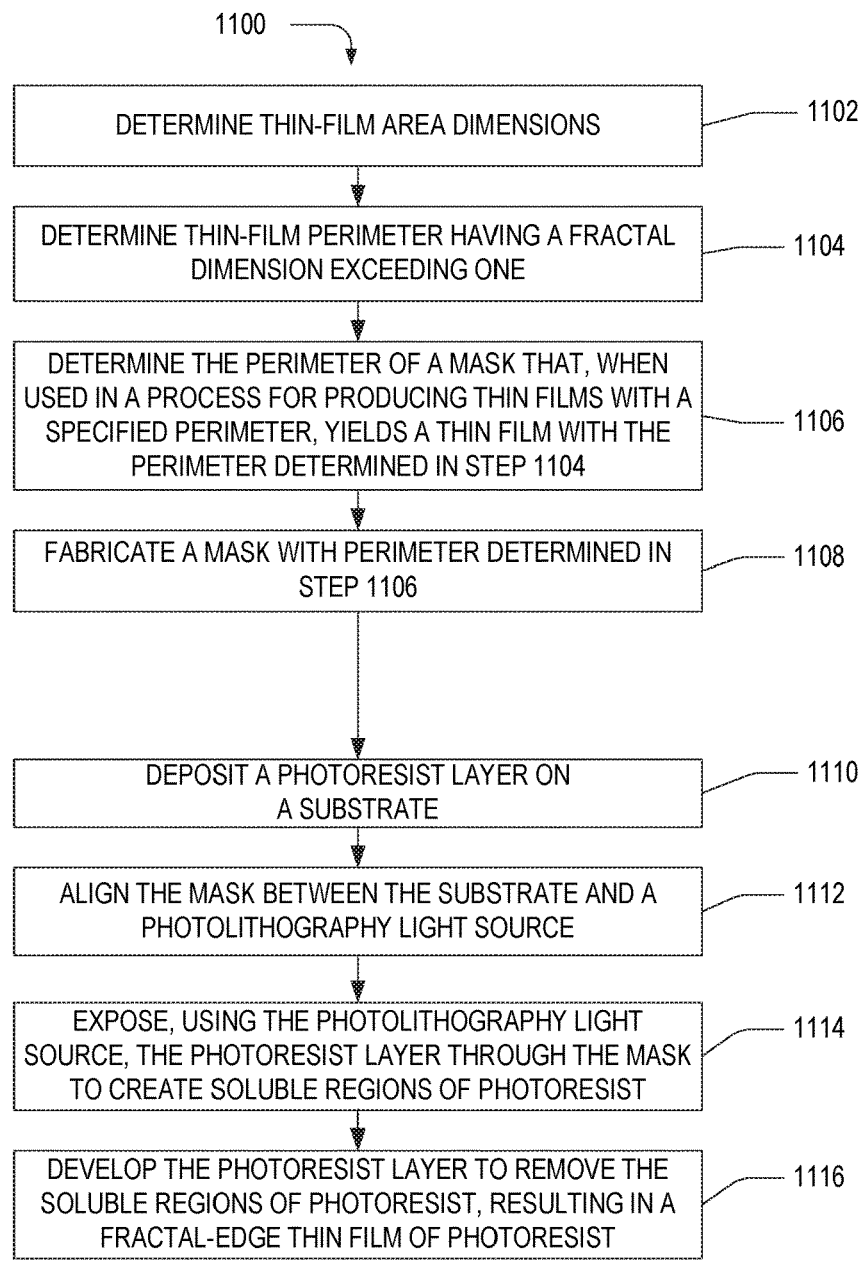
FIG. 11 is a flowchart illustrating a second exemplary method of manufacturing a fractal-edge thin film.

FIG. 11 is a flowchart illustrating an exemplary method 1100 of manufacturing a fractal-edge thin film. Method 1100 is similar to method 1000, except that the fractal-edge thin film is a photoresist. Consequently, method 1100 does not require an analog of step 1009, which deposits a thin-film layer of a non-photoresist material on a substrate. In method 1100, steps 1102, 1104, 1106, and 1108 are identical to steps 1002, 1004, 1006, and 1008 of method 1000, respectively.

In an example of step 1108, the mask is fractal-edge-generating photomask 900. In this embodiment of fractal-edge-generating photomask 900, fractal-edge-generating mask apertures 901 each have a mask perimeter 860 determined by fractal perimeter generator 800. Mask perimeter 860 is shaped such that a photoresist exposed through fractal-edge-generating photomask 900, and subsequently developed by a photoresist developer, has a perimeter with fractal dimension greater than one.

In step 1110, method 1100 deposits a photoresist layer on a substrate. In step 1110 the photoresist layer is deposited directly on a substrate, whereas in step 1010 of method 1000, the photoresist layer is deposited over the thin-film layer deposited in step 1009.

In method 1100, steps 1112 and 1114 are identical to steps 1012 and 1014 of method 1000, respectively.

In step 1116, method 1100 develops the photoresist layer to remove soluble regions of photoresist created in step 1114, resulting in a fractal-edge thin film of photoresist.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall there between.

What is claimed is:

1. A method of manufacturing a fractal-edge thin film, comprising:
   disposing a thin film on a substrate of an image sensor, the substrate having a plurality of light-sensing elements configured to detect light incident on a surface of the substrate; and
   photolithographically etching the thin film, the thin film having a photoresist layer disposed thereon, the photoresist layer having been exposed through a photomask having a photomask perimeter that has a fractal dimension exceeding one.

2. The method of claim 1, further comprising, after the step of etching, stripping remaining photoresist from the fractal-edge thin film.

3. The method of claim 1, further comprising exposing the photoresist layer through the photomask.

* * * * *